(12) United States Patent
Han et al.

(10) Patent No.: US 12,224,728 B2
(45) Date of Patent: Feb. 11, 2025

(54) PHASE SHIFTER FOR LINEARLY SHIFTING PHASE OF INPUT SIGNAL BASED ON PHASE CONTROL SIGNALS

(71) Applicant: ELECTRONICS AND TELECOMMUNICATIONS RESEARCH INSTITUTE, Daejeon (KR)

(72) Inventors: Seon-Ho Han, Daejeon (KR); Bon Tae Koo, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 18/182,571

(22) Filed: Mar. 13, 2023

(65) Prior Publication Data

US 2023/0318577 A1 Oct. 5, 2023

(30) Foreign Application Priority Data

Apr. 1, 2022 (KR) .......... 10-2022-0041212

(51) Int. Cl.
H03H 11/18 (2006.01)
H03H 11/20 (2006.01)

(52) U.S. Cl.
CPC ............. *H03H 11/18* (2013.01); *H03H 11/20* (2013.01)

(58) Field of Classification Search
None
See application file for complete search history.

(56) References Cited

U.S. PATENT DOCUMENTS

| 9,231,559 | B1 | 1/2016 | Davis |
| 10,411,348 | B2 * | 9/2019 | Park .............. H03H 11/20 |
| 2006/0252398 | A1 | 11/2006 | Park |
| 2008/0112519 | A1 | 5/2008 | Jung |
| 2011/0150495 | A1 | 6/2011 | Nosaka |
| 2018/0145660 | A1 | 5/2018 | Qian |
| 2018/0198206 | A1 | 7/2018 | Park |
| 2020/0350679 | A1 | 11/2020 | Yu et al. |

OTHER PUBLICATIONS

Kwang-Jin Koh et al., "0.13-μm CMOS Phase Shifters for X-, Ku-, and K-Band Phased Arrays," IEEE, 2007.
Kwang-Jin Koh et al., "An X- and Ku-Band 8-Element Phased-Array Receiver in 0.18-μm SiGe BiCMOS Technology," IEEE, 2008.

* cited by examiner

*Primary Examiner* — Cassandra F Cox

(57) ABSTRACT

Disclosed is a phase shift circuit including an input circuit for generating first to fourth internal signals based on an in-phase signal, a complementary in-phase signal, a quadrature phase signal, and a complementary quadrature phase signal and a switching circuit for outputting first to fourth shift signals based on the first to fourth internal signals. The input circuit includes a first transistor connected between a ground node and a first node to operate based on the in-phase signal and the first bias signal, a second transistor connected between the ground node and a second node to operate based on the complementary in-phase signal and the first bias signal, a third transistor connected between the ground node and the first node to operate based on the second bias signal, and a fourth transistor connected between the ground node and the second node to operate based on the second bias signal.

11 Claims, 5 Drawing Sheets

PHASE SHIFTER FOR LINEARLY SHIFTING PHASE OF INPUT SIGNAL BASED ON PHASE CONTROL SIGNALS

CROSS-REFERENCE TO RELATED APPLICATIONS

This application claims priority under 35 U.S.C. § 119 to Korean Patent Application No. 10-2022-0041212 filed on Apr. 1, 2022, in the Korean Intellectual Property Office, the disclosures of which are incorporated by reference herein in their entireties.

BACKGROUND

Embodiments of the present disclosure described herein relate to a phase shifter, and more particularly, relate to a phase shifter for linearly shifting a phase of an input signal based on phase control signals.

A phase shift circuit may divide an input signal into an in-phase signal and a quadrature phase signal to shift a phase of the input signal and may adjust a signal magnitude of each of the in-phase signal and the quadrature phase signal depending on phase control signals, thus generating an output signal having a desired phase.

However, because a change in phase of the output signal is not linearly changed according to the control signal, the phase shift circuit using active elements may fail to generate the output signal having the desired phase. Thus, there is a need for a phase shifter for linearly changing a phase of an output signal depending on phase control signals.

SUMMARY

Embodiments of the present disclosure provide a phase shifter for linearly shifting a phase of an input signal based on a control signal.

According to an embodiment, a phase shifter may include a signal generator configured to generate an in-phase signal, a complementary in-phase signal, a quadrature phase signal, and a complementary quadrature phase signal based on an input signal, a controller configured to generate a first selection signal, a second selection signal, a first control signal, and a second control signal, a vector adder, and a digital-to-analog converter configured to generate a first bias signal, a second bias signal, a third bias signal, and a fourth bias signal based on the first control signal and the second control signal. The vector adder may include an input circuit, a switching circuit configured to shift each of phases of a first internal signal, a second internal signal, a third internal signal, and a fourth internal signal received from the input circuit and output a first shift signal, a second shift signal, a third shift signal, and a fourth shift signal, and an output circuit configured to generate an output signal based on the first to fourth shift signals. The input circuit may include a first transistor connected between a ground node for receiving ground power and a first node for generating the first internal signal and configured to operate the in-phase signal and the first bias signal, a second transistor connected between the ground node and a second node for generating the second internal signal and configured to operate based on the complementary in-phase signal and the first bias signal, a third transistor connected between the ground node and the first node and configured to operate based on the second bias signal, a fourth transistor connected between the ground node and the second node and configured to operate based on the second bias signal, a fifth transistor connected between the ground node and a third node for generating the third internal signal and configured to operate based on and the quadrature phase signal and the second bias signal, a sixth transistor connected between the ground node and a fourth node for generating the fourth internal signal and configured to operate based on the complementary quadrature phase signal and the second bias signal, a seventh transistor connected between the ground node and the third node and configured to operate based on the first bias signal, and an eighth transistor connected between the ground node and the fourth node and configured to operate based on the first bias signal. Each of the first control signal and the second control signal may include N bits, where N is a natural number of 2 or more.

In an embodiment, the input circuit may further include a first resistor connected between a gate node of the first transistor and a fifth node for receiving the first bias signal, a second resistor connected between a gate node of the second transistor and the fifth node, a third resistor connected between a gate node of the third transistor and a sixth node for receiving the second bias signal, a fourth resistor connected between a gate node of the fifth transistor and the sixth node, a fifth resistor connected between a gate node of the sixth transistor and the sixth node, and a sixth resistor connected between a gate node of the seventh transistor and the fifth node.

In an embodiment, the input circuit may further include a first capacitor connected between a first input node for receiving the in-phase signal and a gate node of the first transistor, a second capacitor connected between a second input node for receiving the complementary in-phase signal and a gate node of the second transistor, a third capacitor connected between a third input node for receiving the quadrature phase signal and a gate node of the fifth transistor, and a fourth capacitor connected between a fourth input node for receiving the complementary quadrature phase signal and a gate node of the sixth transistor.

In an embodiment, the switching circuit may include a ninth transistor having a gate node connected with a seventh node for receiving the first selection signal and connected between an eighth node for generating the first internal signal and the first node, a first inverter connected between the seventh node and a ninth node, a tenth transistor having a gate node connected with the ninth node and connected between a tenth node for generating the second internal signal and the first node, an eleventh transistor connected between a gate node connected with the ninth node and connected between the eighth node and the second node, a twelfth transistor connected between a gate node connected with the seventh node and connected between the tenth node and the second node, a 13th transistor having a gate node connected with an eleventh node for receiving the second selection signal and connected between a twelfth node for generating the third internal signal and the third node, a second inverter connected between the eleventh node and a 13th node, a 14th transistor having a gate node connected with the 13th node and connected between a 14th node for generating the fourth internal signal and the third node, a 15th transistor having a gate node connected with the 13th node and connected between the twelfth node and the fourth node, and a 16th transistor having a gate node connected with the eleventh node and connected between the 14th node and the fourth node.

In an embodiment, the output circuit may include a 17th transistor having a gate node connected with a 15th node for receiving the third bias signal and connected between a 16th node and the eighth node, an 18th transistor having a gate node connected with the 15th node and connected between a 17th node and the tenth node, a 19th transistor having a gate node connected with an 18th node for receiving the fourth bias signal and connected between the 16th node and the twelfth node, a 20th transistor having a gate node connected with the 18th node and connected between the 17th node and the 14th node, and a load connected between the 16th node and the 17th node. The output signal may have a voltage level being a difference between a voltage level of the 16th node and a voltage level of the 17th node.

In an embodiment, the digital-to-analog converter may include a first current source connected between a power node for receiving a power voltage and a 19th node and configured to operate based on the first control signal, a 21st transistor having a gate node connected with the 19th node for receiving the third bias signal and connected between the 19th node and a 20th node, a 22nd transistor having a gate node connected with the 20th node for receiving the first bias signal and connected between the 20th node and the ground node, a second current source connected between the power node and a 21st node and configured to operate based on the second control signal, a 23rd transistor having a gate node connected with the 21st node for receiving the fourth bias signal and connected between the 21st node and a 22nd node, and a 24th transistor having a gate node connected with the 22nd node for receiving the second bias signal and connected between the 22nd node and the ground node.

In an embodiment, the first current source may include a PMOS transistor having a gate node connected with a 23rd node and connected between the power node and a 24th node, a second PMOS transistor having a gate node connected with a 25th node for receiving a first bit of the first control signal and connected between the 24th node and a 26th node, a third inverter connected between the 25th node and a 27th node, a first NMOS transistor having a gate node connected with the 27th node and connected between the 26th node and the 19th node, a third PMOS transistor having a gate node connected with the 23rd node and connected between the power node and a 28th node, a fourth PMOS transistor having a gate node connected with a 29th node for receiving a second bit of the first control signal and connected between the 28th node and a 30th node, a fourth inverter connected between the 29th node and a 31st node, a second NMOS transistor having a gate node connected with the 31st node and connected between the 30th node and the 19th node, a fifth PMOS transistor having a gate node connected with the 23rd node and connected between the power node and the 23rd node, and a third current source connected between the 23rd node and the ground node.

According to an embodiment, a phase shift circuit may include an input circuit configured to generate a first internal signal, a second internal signal, a third internal signal, and a fourth internal signal based on an in-phase signal, a complementary in-phase signal, a quadrature phase signal, and a complementary quadrature phase signal, a switching circuit configured to output a first shift signal, a second shift signal, a third shift signal, and a fourth shift signal based on the first to fourth internal signals, and an output circuit configured to generate an output signal based on the first to fourth shift signals. The input circuit may further include a first transistor connected between a ground node for receiving ground power and a first node for generating the first internal signal and configured to operate based on the in-phase signal and the first bias signal, a second transistor connected between the ground node and a second node for generating the second internal signal and configured to operate based on the complementary in-phase signal and the first bias signal, a third transistor connected between the ground node and the first node and configured to operate based on the second bias signal, a fourth transistor connected between the ground node and the second node and configured to operate based on the second bias signal, a fifth transistor connected between the ground node and a third node for generating the third internal signal and configured to operate based on the quadrature phase signal and the second bias signal, a sixth transistor connected between the ground node and a fourth node for generating the fourth internal signal and configured to operate based on the complementary quadrature phase signal and the second bias signal, a seventh transistor connected between the ground node and the third node and configured to operate based on the first bias signal, and an eighth transistor connected between the ground node and the fourth node and configured to operate based on the first bias signal.

In an embodiment, the input circuit may further include a first resistor connected between a gate node of the first transistor and a fifth node for receiving the first bias signal, a second resistor connected between a gate node of the second transistor and the fifth node, a third resistor connected between a gate node of the third transistor and a sixth node for receiving the second bias signal, a fourth resistor connected between a gate node of the fifth transistor and the sixth node, a fifth resistor connected between a gate node of the sixth transistor and the sixth node, and a sixth resistor connected between a gate node of the seventh transistor and the fifth node.

In an embodiment, the input circuit may further include a first capacitor connected between a first input node for receiving the in-phase signal and a gate node of the first transistor, a second capacitor connected between a second input node for receiving the complementary in-phase signal and a gate node of the second transistor, a third capacitor connected between a third input node for receiving the quadrature phase signal and a gate node of the fifth transistor, and a fourth capacitor connected between a fourth input node for receiving the complementary quadrature phase signal and a gate node of the sixth transistor.

In an embodiment, the switching circuit may include a ninth transistor having a gate node connected with a seventh node for receiving a first selection signal and connected between an eighth node for generating the first internal signal and the first node, a first inverter connected between the seventh node and a ninth node, a tenth transistor having a gate node connected with the ninth node and connected between a tenth node for generating the second internal signal and the first node, an eleventh transistor having a gate node connected with the ninth node and connected between the eighth node and the second node, a twelfth transistor having a gate node connected with the seventh node and connected between the tenth node and the second node, a 13th transistor having a gate node connected with an eleventh node for receiving a second selection signal and connected between an twelfth node for generating the third internal signal and the third node, a second inverter connected between the eleventh node and a 13th node, a 14th transistor having a gate node connected with the 13th node and connected between a 14th node for generating the fourth internal signal and the third node, a 15th transistor having a gate node connected with the 13th node and connected between the twelfth node and the fourth node, and a 16th transistor having a gate node connected with the eleventh node and connected between the 14th node and the fourth node.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that one skilled in the art easily carries out the present disclosure. With regard to the description of the inventive concept, to make the overall understanding easy, similar components will be marked by similar reference signs/numerals in drawings, and thus, additional description will be omitted to avoid redundancy.

Figure 1:
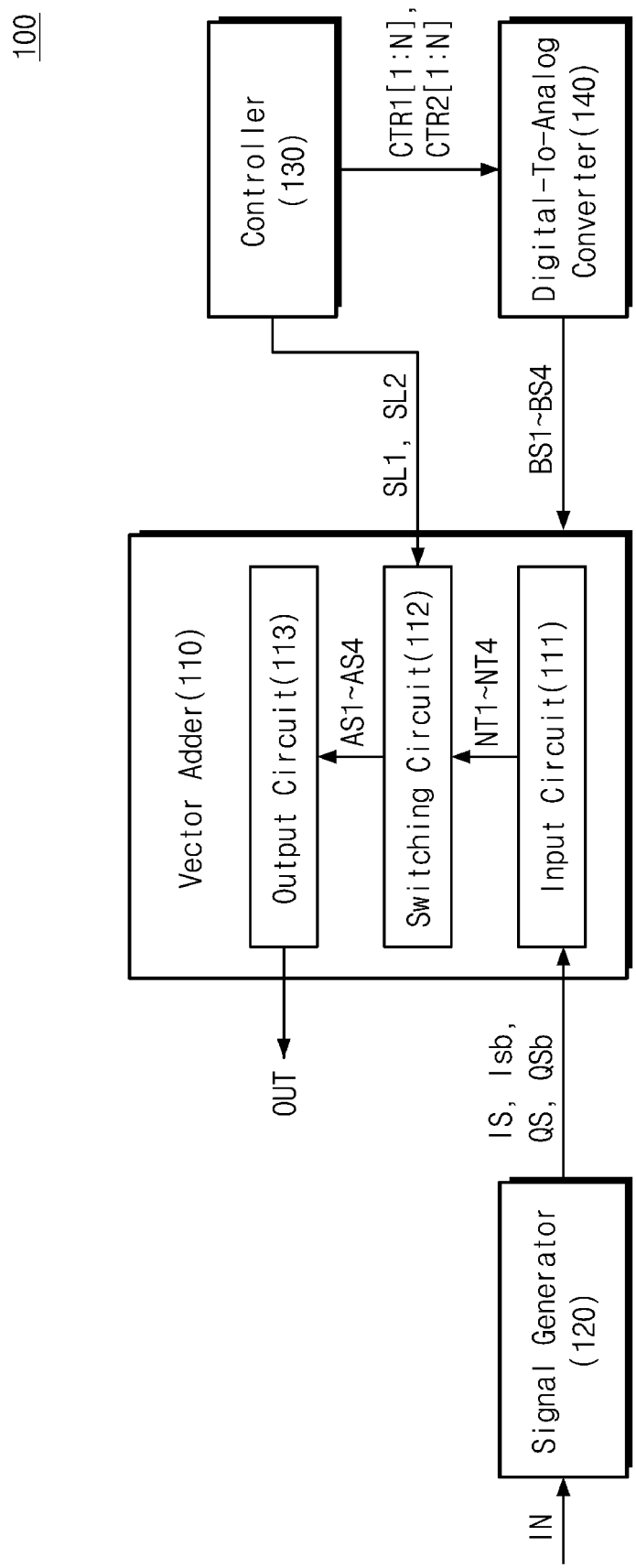
FIG. 1 is a block diagram illustrating in detail a phase shifter according to an embodiment of the present disclosure.

FIG. 1 is a block diagram illustrating in detail a phase shifter according to an embodiment of the present disclosure. Referring to FIG. 1, a phase shifter 100 may include a vector adder 110, a signal generator 120, a controller 130, and a digital-to-analog converter 140.

The phase shifter 100 may shift a phase of an input signal IN based on a first selection signal SL1 and a second selection signal SL2 of the controller 130.

The signal generator 120 may generate an in-phase signal IS, a complementary in-phase signal ISb, a quadrature phase signal QS, and a complementary quadrature phase signal QSb. The in-phase signal IS and the complementary in-phase signal ISb may be signals, each of which has an in-phase component of the input signal IN. The in-phase signal IS and the complementary in-phase signal ISb may have phases complementary to each other. The quadrature phase signal QS and the complementary quadrature phase signal QSb may be signals, each of which has a quadrature phase component of the input signal IN. The quadrature phase signal QS and the complementary quadrature phase signal QSb may have phases complementary to each other. In an embodiment, the signal generator 120 may include elements such as a resistor, an inductor, and a capacitor.

The vector adder 110 may adjust a gain and a path of each of the in-phase signal IS, the complementary in-phase signal ISb, the quadrature phase signal QS, and the complementary quadrature phase signal QSb to generate an output signal OUT where the phase of the input signal IN is varied. The vector adder 110 may include an input circuit 111, a switching circuit 112, and an output circuit 113.

The input circuit 111 may generate a first internal signal NT1, a second internal signal NT2, a third internal signal NT3, and a fourth internal signal NT4 from the in-phase signal IS, the complementary in-phase signal ISb, the quadrature phase signal QS, and the complementary quadrature phase signal QSb based on a first bias signal BS1, a second bias signal BS2, a third bias signal BS3, and a fourth bias signal BS4. The input circuit 111 may receive the first to fourth bias signals BS1 to BS4 from the digital-to-analog converter 140.

The switching circuit 112 may control each of phases of the first internal signal NT1 and the second internal signal NT2, based on the first selection signal SL1 and the second selection signal SL2 to generate a first shift signal AS1 and a second shift signal AS2. The switching circuit 112 may control each of phases of the third internal signal NT3 and the fourth internal signal NT4, based on the second selection signal SL2 to generate a third shift signal AS3 and a fourth shift signal AS4. Each of the first selection signal SL1 and the second selection signal SL2 may be a digital signal including a plurality of bits.

The output circuit 113 may add the first to fourth shift signals AS1 to AS4 to generate the output signal OUT. The output signal OUT may be a signal where the phase of the input signal IN is shifted.

The controller 130 may generate the first and second selection signals SL1 and SL2, a first control signal CTR1[1:N], and a second control signal CTR2[1:N]. Each of the first control signal CTR1[1:N] and the second control signal CTR2[1:N] may be a digital signal including first to Nth bits. Here, "N" is a natural number of 2 or more.

The digital-to-analog converter 140 may generate the first to fourth bias signals BS1 to BS4 based on the first control signal CTR1[1:N] and the second control signal CTR2[1:N].

Figure 2:
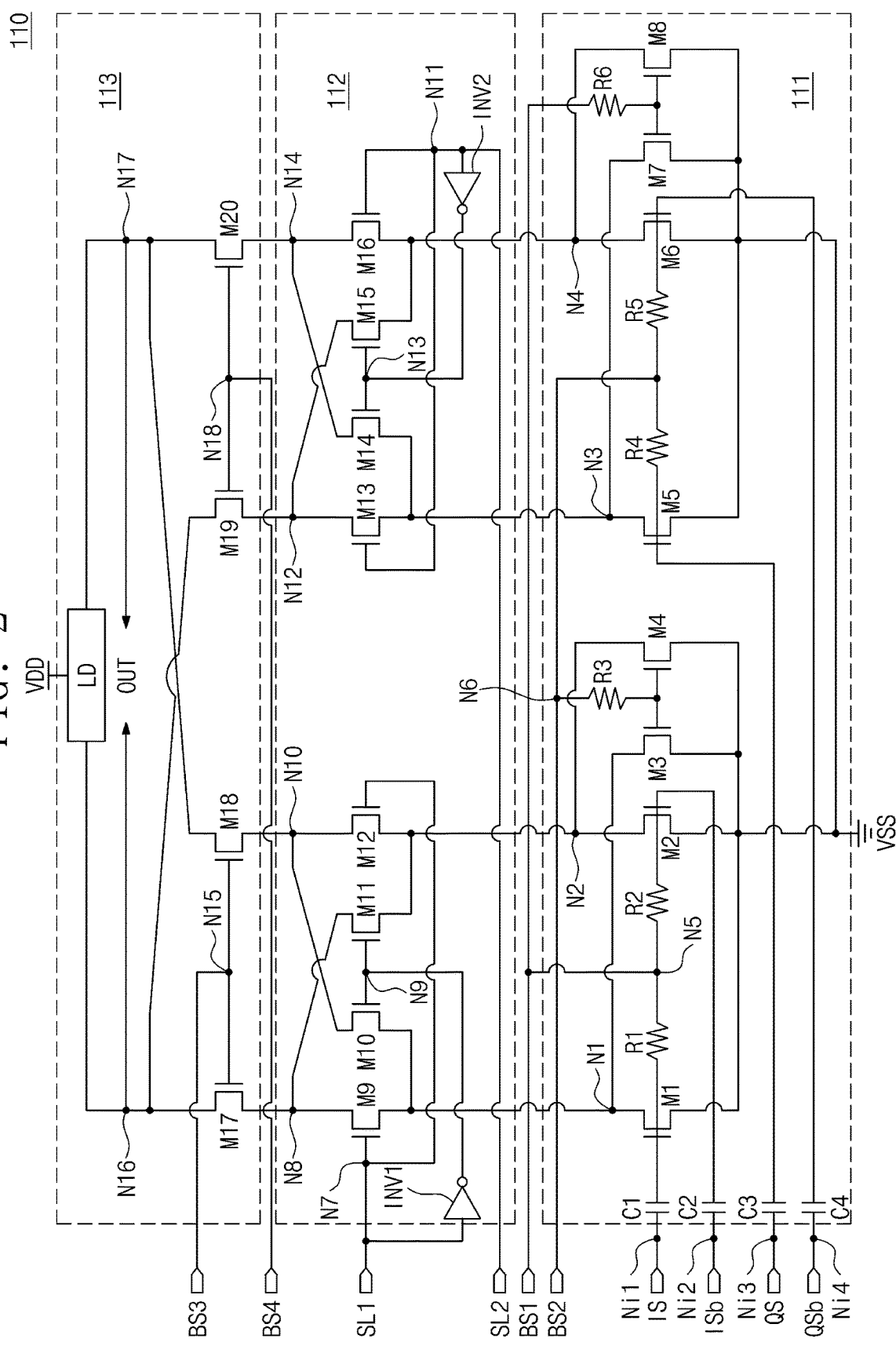
FIG. 2 is a circuit diagram in detail illustrating a vector adder of FIG. 1.

FIG. 2 is a circuit diagram illustrating in detail a vector adder of FIG. 1. Referring to FIG. 2, a vector adder 110 may include an input circuit 111, a switching circuit 112, and an output circuit 113.

The input circuit 111 may generate a first internal signal, a second internal signal, a third internal signal, and a fourth internal signal from an in-phase signal IS, a complementary in-phase signal ISb, a quadrature phase signal QS, and a complementary quadrature phase signal QSb based on a first bias signal BS1, a second bias signal BS2, a third bias signal BS3, and a fourth bias signal BS4.

The input circuit 111 may include a first transistor M1 connected between a ground node for receiving ground power and a first node N1 and configured to operate based on the first bias signal BS1 and a second transistor M2 connected between the ground node and a second node N2 and configured to operate based on the complementary in-phase signal ISb and the first bias signal BS1.

The input circuit 111 may include a third transistor M3 connected between the ground node and the first node N1 and configured to operate based on the second bias signal BS2 and a fourth transistor M4 connected between the ground node and the second node N2 and configured to operate based on the second bias signal BS2.

The first node N1 may be a node which generates the first internal signal. The second node N2 may be a node which generates the second internal signal.

As described above, a gate node of each of the third transistor M3 and the fourth transistor M4 may receive the second bias signal BS2 complementary to the first bias signal BS1 received by a gate node of each of the first transistor M1 and the second transistor M2. In an embodiment, the third transistor M3 may be a transistor complementary to the first transistor M1. The fourth transistor M4 may be a transistor complementary to the second transistor M2.

Thus, the input circuit 111 may generate the first internal signal and the second internal signal which linear change according to a change in the first selection signal SL1, the second selection signal SL2, the first control signal CTR1

[1:N], and the second control signal CTR2[1:N]. Thus, as the first internal signal and the second internal signal linearly change according to the change in the first selection signal SL1, the second selection signal SL2, the first control signal CTR1[1:N], and the second control signal CTR2[1:N], the accuracy of phase shift of the phase shifter may be improved.

The input circuit 111 may include a fifth transistor M5 connected between the ground node and a third node N3 and configured to operate based on the quadrature phase signal QS and the second bias signal BS2 and a sixth transistor M6 connected between the ground node and a fourth node N4 and configured to operate based on the complementary quadrature phase signal QSb and the second bias signal BS2.

The input circuit 111 may include a seventh transistor M7 connected between the ground node and the third node N3 and configured to operate based on the first bias signal BS1 and an eighth transistor M8 connected between the ground node and the fourth node N4 and configured to operate based on the first bias signal BS1.

As described above, a gate node of each of the seventh transistor M7 and the eighth transistor M8 may receive the first bias signal BS1 complementary to the second bias signal BS2 received by a gate node of each of the fifth transistor M5 and the sixth transistor M6. In an embodiment, the seventh transistor M7 may be a transistor complementary to the fifth transistor M5. The eighth transistor M8 may be a transistor complementary to the sixth transistor M6.

Thus, the input circuit 111 may generate the third internal signal and the fourth internal signal which linear change according to a change in the first selection signal SL1, the second selection signal SL2, the first control signal CTR1[1:N], and the second control signal CTR2[1:N]. As the third internal signal and the fourth internal signal linearly change according to the change in the first selection signal SL1, the second selection signal SL2, the first control signal CTR1[1:N], and the second control signal CTR2[1:N], the accuracy of phase shift of the phase shifter may be improved.

The third node N3 may be a node which generates the third internal signal. The fourth node N4 may be a node which generates the fourth internal signal. In an embodiment, each of the first to eighth transistors M1 to M8 may be implemented as an NMOS transistor.

The input circuit 111 may include a first resistor R1 connected between the gate node of the first transistor M1 and a fifth node N5, a second resistor R2 connected between the gate node of the second transistor M2 and the fifth node N5, a third resistor R3 connected between the gate node of the third transistor M3 and a sixth node N6, a fourth resistor R4 connected between the gate node of the fifth transistor M5 and the sixth node N6, a fifth resistor R5 connected between the gate node of the sixth transistor M6 and the sixth node N6, and a sixth resistor R6 connected between the gate node of the seventh transistor M7 and the fifth node N5. The fifth node N5 may be a node which receives the first bias signal BS1 from a controller 130 (refer to FIG. 1). The sixth node N6 may be a node which receives the second bias signal BS2 from the controller 130.

The input circuit 111 may include a first capacitor C1 connected between a first input node Ni1 for receiving the in-phase signal IS and the gate node of the first transistor M1, a second capacitor C2 connected between a second input node Ni2 for receiving the complementary in-phase signal ISb and the gate node of the second transistor M2, a third capacitor C3 connected between a third input node Ni3 for receiving the quadrature phase signal QS and the gate node of the fifth transistor M5, and a fourth capacitor C4 connected between a fourth input node Ni4 for receiving the complementary quadrature phase signal QSb and the gate node of the sixth transistor M6.

The switching circuit 112 may control each of phases of the first to fourth internal signals, based on the first selection signal SL1 and the second selection signal SL2. The switching circuit 112 may include a ninth transistor M9 having a gate node connected with a seventh node N7 and connected between an eighth node N8 and the first node N1, a first inverter INV1 connected between the seventh node N7 and a ninth node N9, a tenth transistor M10 having a gate node connected with the ninth node N9 and connected between a tenth node N10 and the first node N1, an eleventh transistor M11 having a gate node connected with the ninth node N9 and connected between the eighth node N8 and the second node N2, and a twelfth transistor M12 having a gate node connected with the seventh node N7 and connected between the tenth node N10 and the second node N2. The first inverter INV1 may invert and deliver the first selection signal SL1 to the ninth node N9.

The switching circuit 112 may include a 13th transistor M13 having a gate node connected with an eleventh node N11 and connected between a twelfth node N12 and the third node N3, a second inverter INV2 connected between the eleventh node N11 and a 13th node N13, a 14th transistor M14 having a gate node connected with the 13th node N13 and connected between a 14th node N14 and the third node N3, a 15th transistor M15 having a gate node connected with the 13th node N13 and connected between the twelfth node N12 and the fourth node N4, and a 16th transistor M16 having a gate node connected with the eleventh node N11 and connected between the 14th node N14 and the fourth node N4. The second inverter INV2 may invert and deliver the second selection signal SL2 to the 13th node N13.

In an embodiment, each of the ninth to 16th transistors M9 to M16 may be implemented as an NMOS transistor. The seventh node N7 may be a node which receives the first selection signal SL1. The eighth node N8 may be a node which generates a first shift signal. The tenth node N10 may be a node which generates a second shift signal. The eleventh node N11 may be a node which receives the second selection signal SL2. The twelfth node N12 may be a node which generates a third shift signal. The 14th node N14 may be a node which generates a fourth shift signal.

As each of the ninth to twelfth transistors M9 to M12 of the switching circuit 112 operates based on the first selection signal SL1 and each of the 13th to 16th transistors M13 to M16 operates based on the second selection signal SL2, a phase range of the output signal OUT may be selected as one of four quadrants of 360 degrees.

The output circuit 113 may add the first to fourth shift signal to generate the output signal OUT. The output circuit 113 may include a 17th transistor M17 having a gate node connected with a 15th node N15 and connected between a 16th node N16 and the eighth node N8, an 18th transistor M18 having a gate node connected with the 15th node N15 and connected between a 17th node N17 and the tenth node N10, a 19th transistor M19 having a gate node connected with an 18th node N18 and connected between the 16th node N16 and the twelfth node N12, and a 20th transistor M20 having a gate node connected with the 18th node N18 and connected between the 17th node N17 and the 14th node N14.

As the input circuit 111 and the output circuit 113 have a cascode structure, except for the ninth to 16th transistors M9 to M16 of the switching circuit 112 which operates as a switch, the vector adder 110 may operate at a low voltage and isolation characteristics of the input circuit 111 and the output circuit 113 may be improved.

The 15th node N15 may be a node which receives the third bias signal BS3. The 18th node N18 may be a node which receives the fourth bias signal BS4. In an embodiment, each of the 17th to 20th transistors M17 to M20 may be implemented as an NMOS transistor.

The output circuit 113 may include an RLC load LD connected between the 16th node N16 and the 17th node N17. The RLC load LD may be a load implemented with a resistor, an inductor, and capacitors. A voltage level of the output signal OUT may have a difference between a voltage level of the 16th node N16 and a voltage level of the 17th node N17.

Figure 3:
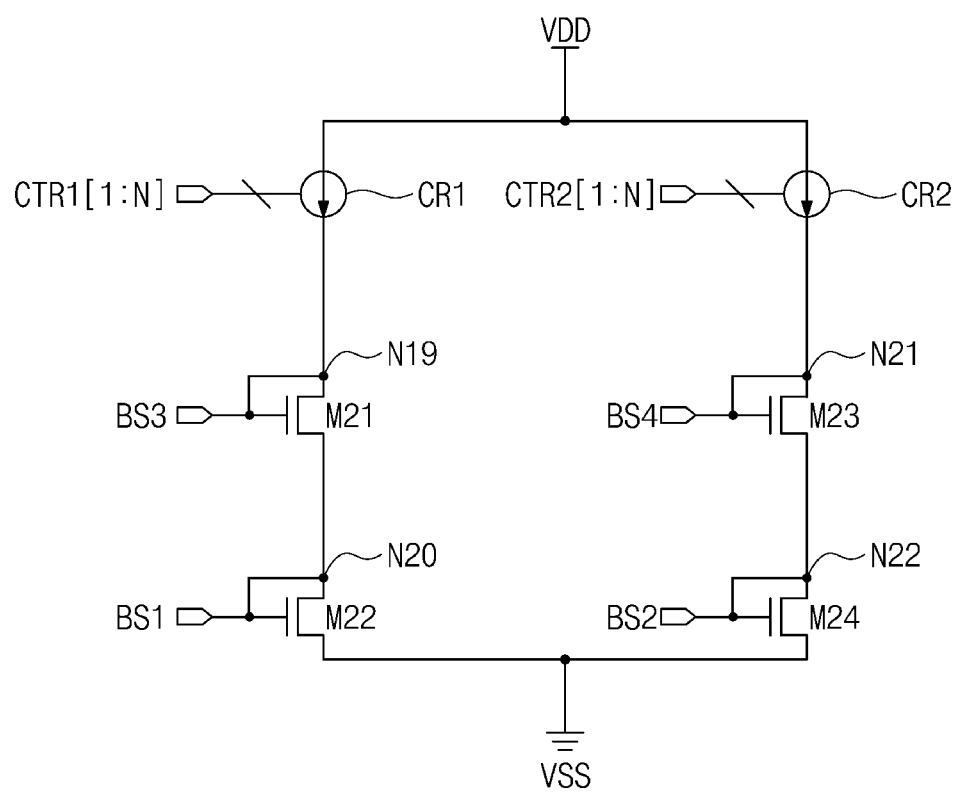
FIG. 3 is a circuit diagram illustrating in detail a digital-to-analog converter of FIG. 1.

FIG. 3 is a circuit diagram illustrating in detail a digital-to-analog converter of FIG. 1. Referring to FIG. 3, a digital-to-analog converter 140 may include a first current source CR1, a second current source CR2, and 21st to 24th transistors M21 to M24.

The digital-to-analog converter 140 may include the first current source CR1 connected between a power node for receiving a power voltage and a 19th node N19 to operate based on a first control signal CTR1[1:N], the 21st transistor M21 having a gate node connected with the 19th node N19 for receiving a third bias signal BS3 and connected between the 19th node N19 and a 20th node N20, and the 22nd transistor M22 having a gate node connected with the 20th node N20 for receiving a first bias signal BS1 and connected between the 20th node N20 and a ground node. The digital-to-analog converter 140 may generate the first bias signal BS1 and the third bias signal BS3 based on the first control signal CTR1[1:N]. The first control signal CTR1[1:N] may be to determine a magnitude of current flowing in transistors associated with an in-phase signal and a complementary in-phase signal.

The digital-to-analog converter 140 may include the second current source CR2 connected between the power node and a 21st node N21 to operate based on a second control signal CTR2[1:N], the 23rd transistor M23 having a gate node connected with the 21st node N21 for receiving a fourth bias signal BS4 and connected between the 21st node N21 and a 22nd node N22, and the 24th transistor M24 having a gate node connected with the 22nd node N22 for receiving a second bias signal BS2 and connected between the 22nd node N22 and the ground node. The digital-to-analog converter 140 may generate the second bias signal BS2 and the fourth bias signal BS4 based on the second control signal CTR2[1:N]. The second control signal CTR2 [1:N] may be to determine a magnitude of current flowing in transistors associated with a quadrature phase signal and a complementary quadrature phase signal.

In detail, referring to FIGS. 2 and 3, as each of the gate nodes of the 21st transistor M21, the 17th transistor M17, and the 18th transistor M18 receives the third bias signal BS3, the 21st transistor M21, the 17th transistor M17, and the 18th transistor M18 may operate as a current mirror circuit. In other words, a magnitude of current flowing in the 17th transistor M17 and the 18th transistor M18 may be determined based on a magnitude of current flowing in the 21st transistor M21.

As each of the gate nodes of the 23rd transistor M23, the 19th transistor M19, and the 20th transistor M20 receives the fourth bias signal BS4, the 23rd transistor, the 19th transistor M19, and the 20th transistor M20 may operate as a current mirror circuit. In other words, a magnitude of current flowing in the 19th transistor M19 and the 20th transistor M20 may be determined based on a magnitude of current flowing in the 23rd transistor M23.

As each of the gate nodes of the 22nd transistor M22, the first transistor M1, the second transistor M2, the seventh transistor M7, and the eighth transistor M8 receives the first bias signal BS1, the 22nd transistor M22, the first transistor M1, the second transistor M2, the seventh transistor M7, and the eighth transistor M8 may operate as a current mirror circuit. In other words, a magnitude of current flowing in the first transistor M1, the second transistor M2, the seventh transistor M7, and the eighth transistor M8 may be determined based on a magnitude of current flowing in the 22nd transistor M22.

As each of the gate nodes of the 24th transistor M24, the third transistor M3, the fourth transistor M4, the fifth transistor M5, and the sixth transistor M6 receives the second bias signal BS2, the 24th transistor M24, the third transistor M3, the fourth transistor M4, the fifth transistor M5, and the sixth transistor M6 may operate as a current mirror circuit. In other words, a magnitude of current flowing in the third transistor M3, the fourth transistor M4, the fifth transistor M5, and the sixth transistor M6 may be determined based on a magnitude of current flowing in the 24th transistor M24. Thus, the digital-to-analog converter 140 may generate current signals provided to a vector adder 110.

Figure 4:
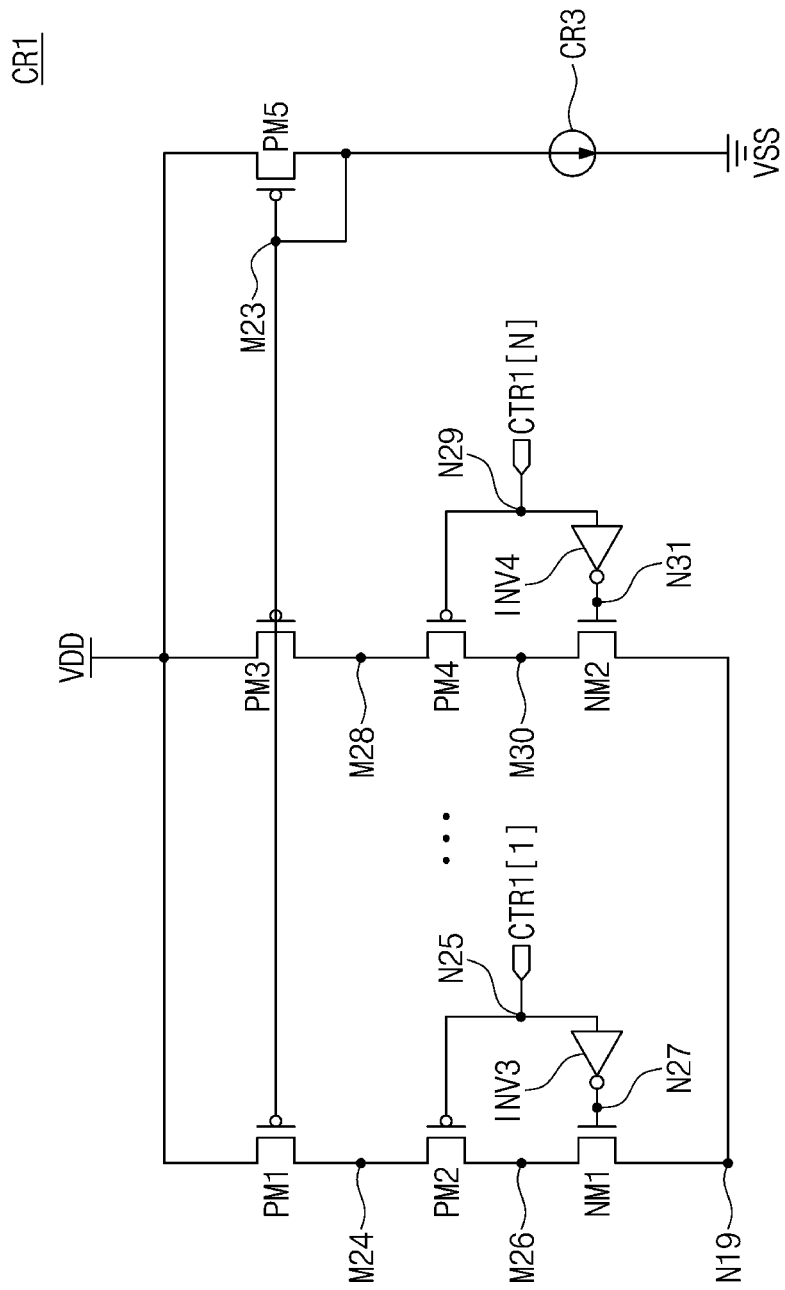
FIG. 4 is a circuit diagram illustrating in detail a first current source of FIG. 3.

FIG. 4 is a circuit diagram illustrating in detail a first current source of FIG. 3. Referring to FIG. 4, a first current source CR1 for generating a current signal based on a first control signal CTR1[1:N] is illustrated.

The first control signal CTR1[1:N] may be a digital signal including first to Nth bits. The first current source CR1 may include a first PMOS transistor PM1 having a gate node connected with a 23rd node N23 and connected between a power node and a 24th node N24, a second PMOS transistor PM2 having a gate node connected with a 25th node N25 for receiving a first bit CTR1[1] and connected between the 24 node N24 and a 26th node N26, a third inverter INV3 connected between the 25th node N25 and a 27th node N27, and a first NMOS transistor NM1 having a gate node connected with the 27th node N27 and connected between the 26th node N26 and a 19th node N19.

The first current source CR1 may include a fifth PMOS transistor PM5 having a gate node connected with the 23rd node N23 and connected between the power node and the 23rd node N23 and a third current source CR3 connected between the 23rd node N23 and a ground node.

As each of the second PMOS transistor PM2 and the first NMOS transistor NM1 is implemented as a CMOS transistor for receiving the first bit CTR1[1], the switching of current of a digital-to-analog converter may be effectively controlled. In other words, the digital-to-analog converter may generate current signals, each of which has a magnitude intended by a user, depending on the first control signal CTR1[1:N].

As described above, the first current source CR1 may include transistors and inverters corresponding to each of second to Nth bits CTR1[2:N] to be similar to the first and second PMOS transistors PM1 and PM2 and the first NMOS transistor NM1 corresponding to the first bit CTR1[1].

In an embodiment, the first current source CR1 may include third and fourth PMOS transistors PM3 and PM4, a second NMOS transistor NM2, and a fourth inverter INV4 corresponding to an Nth bit CTR1[N].

In detail, the first current source CR1 may include the third PMOS transistor PM3 having a gate node connected with the 23rd node N23 and connected between the power node and a 28th node N28, the fourth PMOS transistor PM4 having a gate node connected with a 29th node N29 for receiving an Nth bit CTR1[N] and connected between the 28 node N28 and a 30th node N30, the fourth inverter INV4 connected between the 29th node N29 and a 31st node N31, and the second NMOS transistor NM2 having a gate node connected with the 31st node N31 and connected between the 30th node N30 and the 19th node N19.

Figure 5:
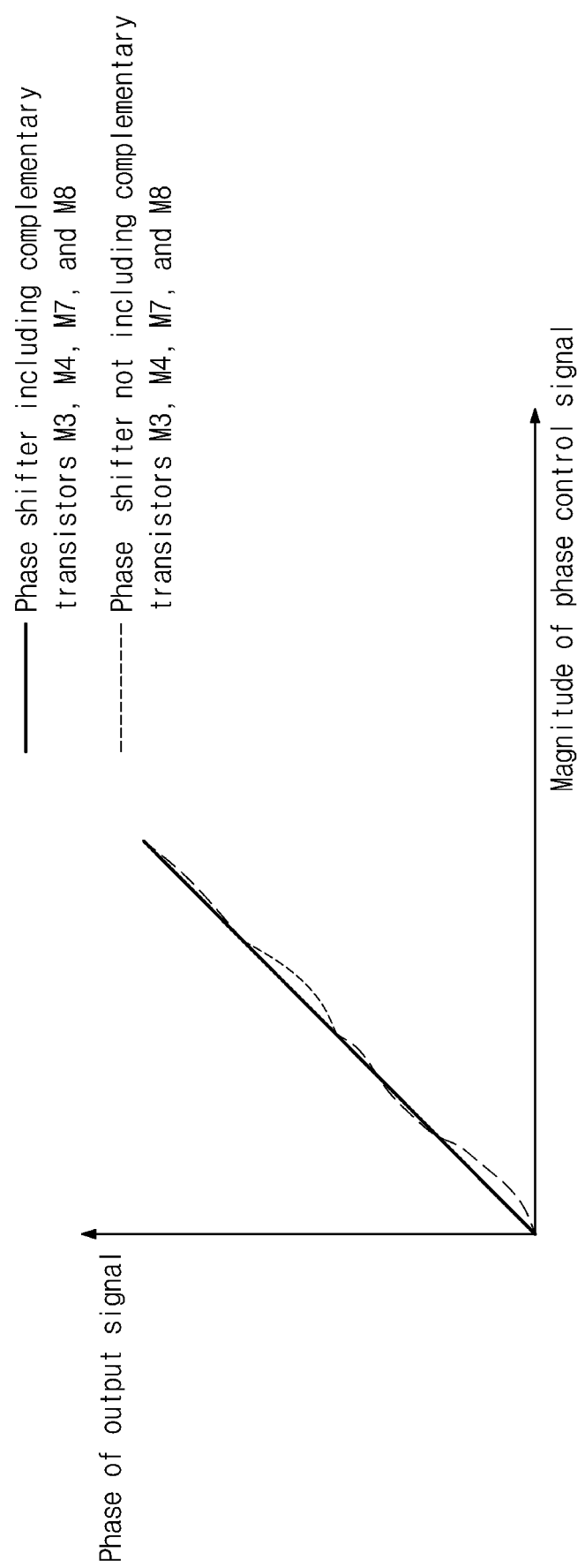
FIG. 5 is a graph illustrating an output signal according to an embodiment of the present disclosure.

FIG. 5 is a graph illustrating an output signal according to an embodiment of the present disclosure. Referring to FIGS. 2, 3, and 5, an output signal OUT of a phase shifter including complementary transistors M3, M4, M7, and M8 and an output signal of a phase shifter not including the complementary transistors M3, M4, M7, and M8 are illustrated. The horizontal axis indicates a magnitude of a phase control signal. The vertical axis indicates a phase of the output signal.

In an embodiment, the phase control signal may refer to at least one of a first selection signal SL1, a second selection signal SL2, a first control signal CTR1[1:N], and a second control signal CTR2[1:N].

For the phase shifter including the complementary transistors M3, M4, M7, and M8, a change in phase of the output signal OUT may be linear according to a change in magnitude of the phase control signal. On the other hand, for the phase shifter not including the complementary transistors M3, M4, M7, and M8, a change in phase of the output signal may not be linear according to a change in magnitude of the phase control signal.

In other words, as a gate node of each of the third transistor M3 and the fourth transistor M4 receives a second bias signal BS2 complementary to a first bias signal BS1 received by a gate node of each of a first transistor M1 and a second transistor M2 and a gate node of each of the seventh transistor M7 and the eighth transistor M8 receives the first bias signal BS1 complementary to the second bias signal BS2 received by a gate node of each of a fifth transistor M5 and a sixth transistor M6, the phase shifter may generate the output signal OUT where the change in phase is linear, depending on a change in magnitude of the phase control signal.

According to an embodiment of the present disclosure, a phase shifter for linearly shifting a phase of an input signal based on a control signal may be provided.

According to an embodiment of the present disclosure, a phase shifter for operating at a low voltage and having high-phase resolution may be provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A phase shift circuit, comprising:
a signal generator configured to generate an in-phase signal, a complementary in-phase signal, a quadrature phase signal, and a complementary quadrature phase signal based on an input signal;
a controller configured to generate a first selection signal, a second selection signal, a first control signal, and a second control signal;
a vector adder; and
a digital-to-analog converter configured to generate a first bias signal, a second bias signal, a third bias signal, and a fourth bias signal based on the first control signal and the second control signal,
wherein the vector adder includes:
an input circuit;
a switching circuit configured to shift each of phases of a first internal signal, a second internal signal, a third internal signal, and a fourth internal signal received from the input circuit and output a first shift signal, a second shift signal, a third shift signal, and a fourth shift signal; and
an output circuit configured to generate an output signal based on the first to fourth shift signals,
wherein the input circuit includes:
a first transistor connected between a ground node for receiving ground power and a first node for generating the first internal signal and configured to operate based on the in-phase signal and the first bias signal;
a second transistor connected between the ground node and a second node for generating the second internal signal and configured to operate based on the complementary in-phase signal and the first bias signal;
a third transistor connected between the ground node and the first node and configured to operate based on the second bias signal;
a fourth transistor connected between the ground node and the second node and configured to operate based on the second bias signal;
a fifth transistor connected between the ground node and a third node for generating the third internal signal and configured to operate based on the quadrature phase signal and the second bias signal;
a sixth transistor connected between the ground node and a fourth node for generating the fourth internal signal and configured to operate based on the complementary quadrature phase signal and the second bias signal;
a seventh transistor connected between the ground node and the third node and configured to operate based on the first bias signal; and
an eighth transistor connected between the ground node and the fourth node and configured to operate based on the first bias signal, and wherein each of the first control signal and the second control signal includes N bits, where N is a natural number of 2 or more.

2. The phase shift circuit of claim 1, wherein the input circuit further includes:
a first resistor connected between a gate node of the first transistor and a fifth node for receiving the first bias signal;
a second resistor connected between a gate node of the second transistor and the fifth node;
a third resistor connected between a gate node of the third transistor and a sixth node for receiving the second bias signal;
a fourth resistor connected between a gate node of the fifth transistor and the sixth node;
a fifth resistor connected between a gate node of the sixth transistor and the sixth node; and
a sixth resistor connected between a gate node of the seventh transistor and the fifth node.

3. The phase shift circuit of claim 1, wherein the input circuit further includes:
a first capacitor connected between a first input node for receiving the in-phase signal and a gate node of the first transistor;
a second capacitor connected between a second input node for receiving the complementary in-phase signal and a gate node of the second transistor;
a third capacitor connected between a third input node for receiving the quadrature phase signal and a gate node of the fifth transistor; and a fourth capacitor connected between a fourth input node for receiving the complementary quadrature phase signal and a gate node of the sixth transistor.

4. The phase shift circuit of claim 1, wherein the switching circuit includes:
a ninth transistor having a gate node connected with a seventh node for receiving the first selection signal and connected between an eighth node for generating the first internal signal and the first node;
a first inverter connected between the seventh node and a ninth node;
a tenth transistor having a gate node connected with the ninth node and connected between a tenth node for generating the second internal signal and the first node;
an eleventh transistor connected between a gate node connected with the ninth node and connected between the eighth node and the second node;
a twelfth transistor connected between a gate node connected with the seventh node and connected between the tenth node and the second node;
a 13th transistor having a gate node connected with an eleventh node for receiving the second selection signal and connected between a twelfth node for generating the third internal signal and the third node;
a second inverter connected between the eleventh node and a 13th node;
a 14th transistor having a gate node connected with the 13th node and connected between a 14th node for generating the fourth internal signal and the third node;
a 15th transistor having a gate node connected with the 13th node and connected between the twelfth node and the fourth node; and
a 16th transistor having a gate node connected with the eleventh node and connected between the 14th node and the fourth node.

5. The phase shift circuit of claim 4, wherein the output circuit includes:
a 17th transistor having a gate node connected with a 15th node for receiving the third bias signal and connected between a 16th node and the eighth node;
an 18th transistor having a gate node connected with the 15th node and connected between a 17th node and the tenth node;
a 19th transistor having a gate node connected with an 18th node for receiving the fourth bias signal and connected between the 16th node and the twelfth node;
a 20th transistor having a gate node connected with the 18th node and connected between the 17th node and the 14th node; and
a load connected between the 16th node and the 17th node, and
wherein the output signal has a voltage level being a difference between a voltage level of the 16th node and a voltage level of the 17th node.

6. The phase shift circuit of claim 1, wherein the digital-to-analog converter includes:
a first current source connected between a power node for receiving a power voltage and a 19th node and configured to operate based on the first control signal;
a 21st transistor having a gate node connected with the 19th node for receiving the third bias signal and connected between the 19th node and a 20th node;
a 22nd transistor having a gate node connected with the 20th node for receiving the first bias signal and connected between the 20th node and the ground node;

a second current source connected between the power node and a 21st node and configured to operate based on the second control signal;
a 23rd transistor having a gate node connected with the 21st node for receiving the fourth bias signal and connected between the 21st node and a 22nd node; and
a 24th transistor having a gate node connected with the 22nd node for receiving the second bias signal and connected between the 22nd node and the ground node.

7. The phase shift circuit of claim 6, wherein the first current source includes:
a PMOS transistor having a gate node connected with a 23rd node and connected between the power node and a 24th node;
a second PMOS transistor having a gate node connected with a 25th node for receiving a first bit of the first control signal and connected between the 24th node and a 26th node;
a third inverter connected between the 25th node and a 27th node;
a first NMOS transistor having a gate node connected with the 27th node and connected between the 26th node and the 19th node;
a third PMOS transistor having a gate node connected with the 23rd node and connected between the power node and a 28th node;
a fourth PMOS transistor having a gate node connected with a 29th node for receiving a second bit of the first control signal and connected between the 28th node and a 30th node;
a fourth inverter connected between the 29th node and a 31st node;
a second NMOS transistor having a gate node connected with the 31st node and connected between the 30th node and the 19th node;
a fifth PMOS transistor having a gate node connected with the 23rd node and connected between the power node and the 23rd node; and
a third current source connected between the 23rd node and the ground node.

8. A phase shift circuit, comprising:
an input circuit configured to generate a first internal signal, a second internal signal, a third internal signal, and a fourth internal signal based on an in-phase signal, a complementary in-phase signal, a quadrature phase signal, and a complementary quadrature phase signal;
a switching circuit configured to output a first shift signal, a second shift signal, a third shift signal, and a fourth shift signal based on the first to fourth internal signals; and
an output circuit configured to generate an output signal based on the first to fourth shift signals,
wherein the input circuit further includes:
a first transistor connected between a ground node for receiving ground power and a first node for generating the first internal signal and configured to operate based on the in-phase signal and a first bias signal;
a second transistor connected between the ground node and a second node for generating the second internal signal and configured to operate based on the complementary in-phase signal and the first bias signal;
a third transistor connected between the ground node and the first node and configured to operate based on a second bias signal;
a fourth transistor connected between the ground node and the second node and configured to operate based on the second bias signal;

a fifth transistor connected between the ground node and a third node for generating the third internal signal and configured to operate based on the quadrature phase signal and the second bias signal;

a sixth transistor connected between the ground node and a fourth node for generating the fourth internal signal and configured to operate based on the complementary quadrature phase signal and the second bias signal;

a seventh transistor connected between the ground node and the third node and configured to operate based on the first bias signal; and an eighth transistor connected between the ground node and the fourth node and configured to operate based on the first bias signal.

9. The phase shift circuit of claim 8, wherein the input circuit further includes:

a first resistor connected between a gate node of the first transistor and a fifth node for receiving the first bias signal;

a second resistor connected between a gate node of the second transistor and the fifth node;

a third resistor connected between a gate node of the third transistor and a sixth node for receiving the second bias signal;

a fourth resistor connected between a gate node of the fifth transistor and the sixth node;

a fifth resistor connected between a gate node of the sixth transistor and the sixth node; and a sixth resistor connected between a gate node of the seventh transistor and the fifth node.

10. The phase shift circuit of claim 8, wherein the input circuit further includes:

a first capacitor connected between a first input node for receiving the in-phase signal and a gate node of the first transistor;

a second capacitor connected between a second input node for receiving the complementary in-phase signal and a gate node of the second transistor;

a third capacitor connected between a third input node for receiving the quadrature phase signal and a gate node of the fifth transistor; and a fourth capacitor connected between a fourth input node for receiving the complementary quadrature phase signal and a gate node of the sixth transistor.

11. The phase shift circuit of claim 8, wherein the switching circuit includes:

a ninth transistor having a gate node connected with a seventh node for receiving a first selection signal and connected between an eighth node for generating the first internal signal and the first node;

a first inverter connected between the seventh node and a ninth node;

a tenth transistor having a gate node connected with the ninth node and connected between a tenth node for generating the second internal signal and the first node;

an eleventh transistor having a gate node connected with the ninth node and connected between the eighth node and the second node;

a twelfth transistor having a gate node connected with the seventh node and connected between the tenth node and the second node;

a 13th transistor having a gate node connected with an eleventh node for receiving a second selection signal and connected between a twelfth node for generating the third internal signal and the third node;

a second inverter connected between the eleventh node and a 13th node;

a 14th transistor having a gate node connected with the 13th node and connected between a 14th node for generating the fourth internal signal and the third node;

a 15th transistor having a gate node connected with the 13th node and connected between the twelfth node and the fourth node; and a 16th transistor having a gate node connected with the eleventh node and connected between the 14th node and the fourth node.

* * * * *